United States Patent [19]

Ogino et al.

[11] Patent Number: 5,189,347
[45] Date of Patent: Feb. 23, 1993

[54] VIDEO CIRCUIT FOR DRIVING A CATHODE RAY TUBE

[75] Inventors: Masanori Ogino; Takeo Yamada; Miyuki Ikeda; Tsueno Fujikura; Takahiko Fujiwara, all of Yokohama, Japan

[73] Assignee: Hitachi, Ltd., Tokyo, Japan

[21] Appl. No.: 810,298

[22] Filed: Dec. 19, 1991

[30] Foreign Application Priority Data

Dec. 26, 1990 [JP] Japan ................................. 2-417589

[51] Int. Cl.$^5$ .......................... G09G 1/04; H01J 29/70
[52] U.S. Cl. ................................. 315/383; 315/389
[58] Field of Search .............. 315/381, 383, 388, 389, 315/329

[56] References Cited

U.S. PATENT DOCUMENTS 4,973,890 11/1990 Desjandins ........................ 315/383

Primary Examiner—Gregory C. Issing
Attorney, Agent, or Firm—Antonelli, Terry, Stout & Kraus

[57] ABSTRACT

A video output circuit for driving a CRT of a grid-cathode differential drive type is disclosed, in which a collector potential of an output transistor in a horizontal blanking interval is detected by a diode arrangement; the potential thus detected is smoothed by a smoothing filtering arrangement output current of the output transistor is controlled by an output obtained by the smoothing filtering arrangement; and negative feedback control is effected so that the collector potential of the output transistor is made constant. In this way, a bias adjusting power supply, which was required heretofore, is made unnecessary.

6 Claims, 6 Drawing Sheets

VIDEO CIRCUIT FOR DRIVING A CATHODE RAY TUBE

BACKGROUND OF THE INVENTION

The present invention relates to a cathode ray tube (CRT) display and more in detail to a video circuit for driving a type of cathode ray tubes, in which an inputted video signal is amplified by a differential amplifying circuit and applied differentially between a grid electrode and a cathode electrode of a cathode ray tube.

FIG. 6 is a circuit diagram representing a prior art video circuit for driving a cathode ray tube, in which reference numeral 1 is a CRT; 2 and 3 are grounded base type output transistors; 4 and 5 are load resistances therefor; and 6 is a well-known level shift circuit for giving the G1 (grid) electrode a negative bias, the output of the level shift circuit 6 and the output of the transistor 3 being given to the G1 electrode and the K (cathode) electrode of the CRT 1, respectively, to drive them differentially.

7 and 8 represent a pair of differential amplifying transistors; 9 is an emitter resistor for the transistor 7; 10 is a transistor serving as a current source; 11 is an emitter resistor therefor; 12 is an input terminal for a negative polarity input video signal; and 13 is a bias adjusting power supply. Further, in this figure, $V_{DC}$ represents a DC power supply.

As clearly seen already, this circuit is operated When a video signal is inputted to the input terminal 12, an amplified output thereof is obtained on the collector side of the output transistors 2 and 3 so that differential drive is effected between the G1 electrode and the K electrode.

A primary drawback of the prior art technique described above was that the bias adjusting power supply was necessitated in order to absorb fluctuations in characteristics of the resistors 11 and 4 as well as the transistor 10.

Further there was a secondary drawback that in a transient state at a power switch-off, when the potential of the negative polarity video signal applied to the input terminal 12 began to decrease, the potential at G1 (first grid) of the CRT 1 increased, which lowered the potential at K (cathode), and as the result an excessive beam current flowed through the CRT 1, which could burn out the fluorescent surface of the CRT 1.

The above explanation should be further complemented as follows. In the transient state at turning-off the power switch not indicated in the figure, since the operation of a well-known deflecting circuit separately disposed, although it is not indicated in the figure, is rapidly stopped, the electron beam is concentrated at the center of the fluorescent surface. As the result, the fluorescent surface could be burned out by a cooperative effect thereof with the excessive beam current described above.

As another secondary drawback there was a problem that the video output circuit indicated in FIG. 6 had a pulse response dynamic range of the differential amplifying transistors 7 and 8 narrower than that obtained by a usual grounded emitter type circuit.

As described above, the prior art technique had the drawback that it was necessary to use the bias adjusting power supply 13, whose regulation was complicated and difficult.

An object of the present invention is to provide measures for overcoming the drawbacks described above and also to overcome the secondary drawbacks of the prior art technique.

SUMMARY OF THE INVENTION

In order to achieve the above objects, according to the present invention, the lowest value of the collector potential of the output transistor for G1 (2 in FIG. 6) is detected in a horizontal blanking interval and current flowing through the current source transistor 10 is controlled so that the lowest value is equal to a designed reference value, for which a new negative feedback circuit is disposed.

The negative feedback circuit stated above compares the detected lowest collector potential of the output transistor with the designed reference value and acts so as to minimize a difference thus obtained.

Consequently it is possible to omit the bias adjusting power supply, which was required by the prior art technique and whose regulation is complicated and difficult.

DESCRIPTION OF THE PREFERRED EMBODIMENTS

Figure 1:
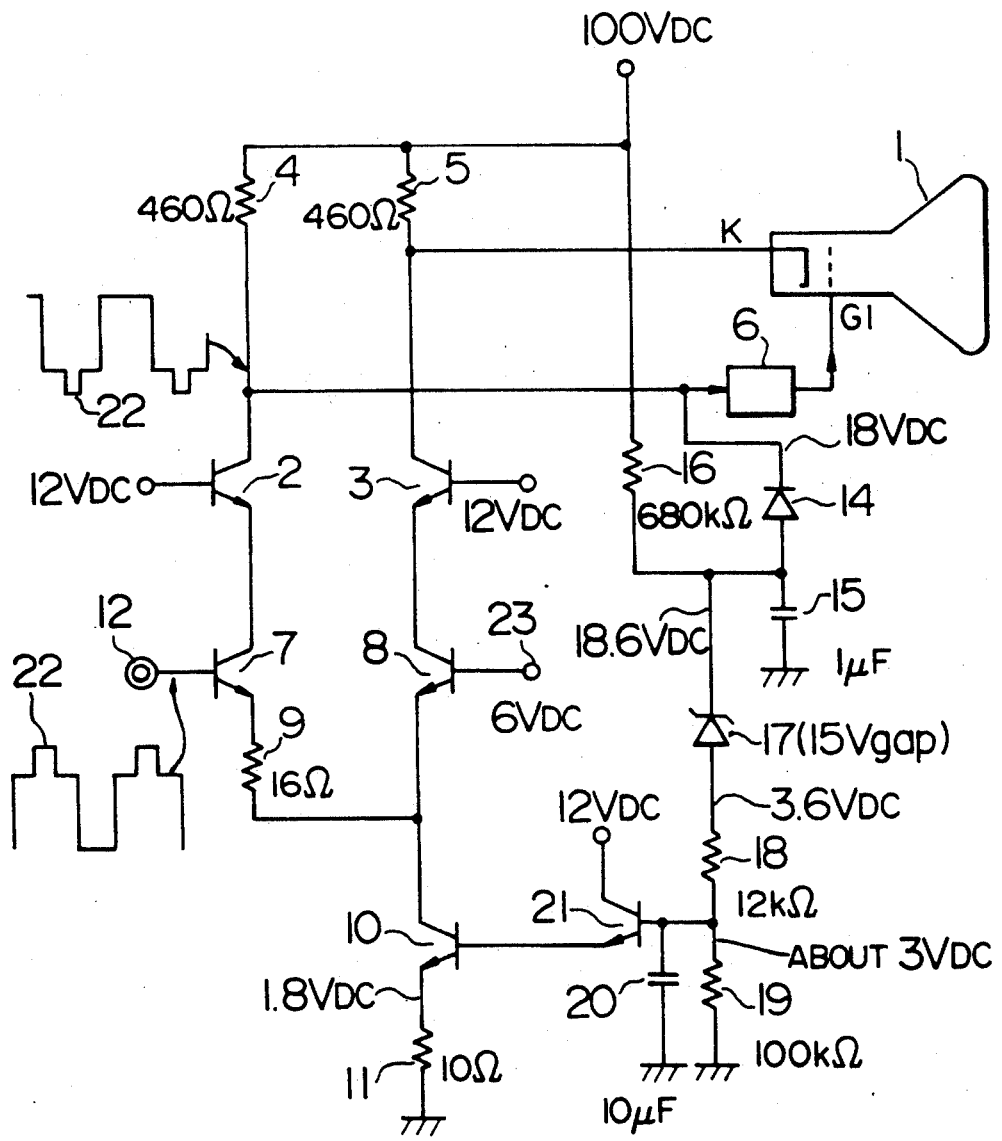
FIG. 1 is a circuit diagram indicating a first embodiment of the present invention.
Figure 6:
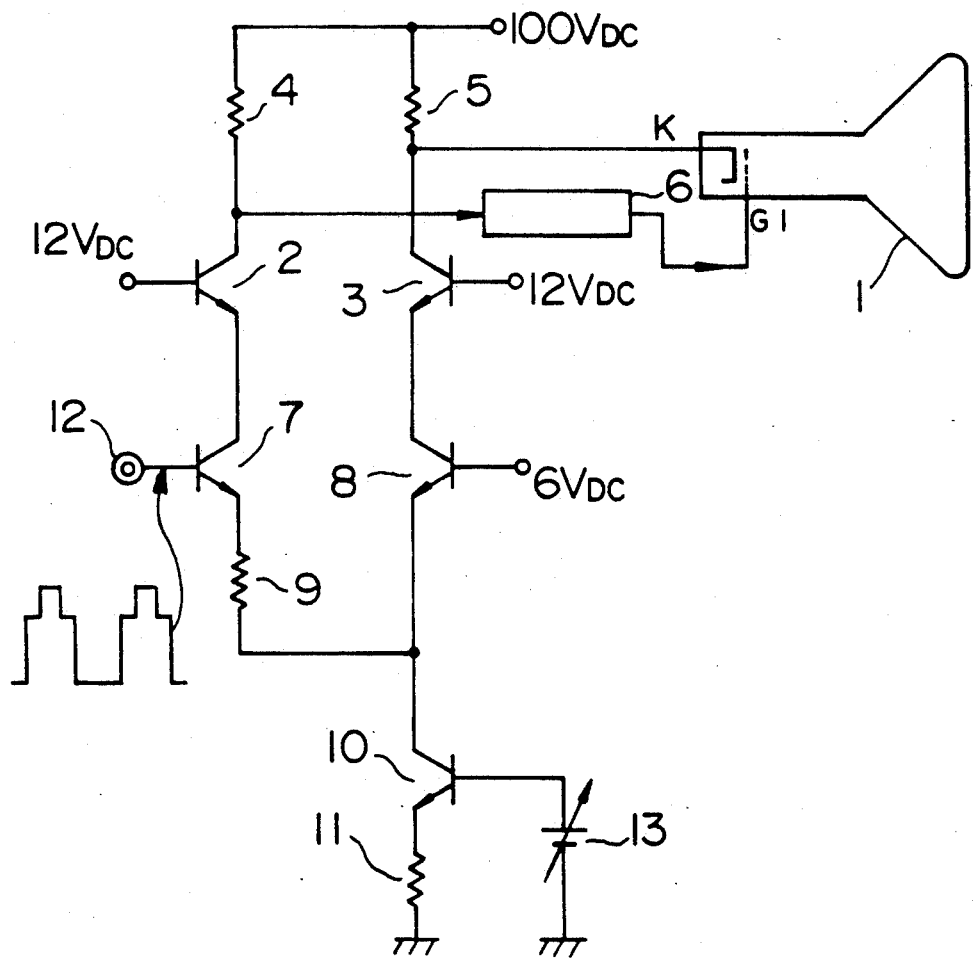
FIG. 6 is a circuit diagram indicating an embodiment, which is a modification of the first embodiment indicated in FIG. 1.

FIG. 1 is a circuit diagram of the first embodiment of the present invention. The reference numerals, which are used also in FIG. 6, mean that the elements indicated thereby have the same functions as those indicated in FIG. 6. Consequently explanation thereof will be omitted. In the figure resistances and capacitances are described for different circuit elements. This is because it is wanted to indicate an example of concrete numerical values required for transmitting video signals in a frequency band of about 70 MHz for reference. It is a matter of course that the present invention is not restricted thereto.

Now the construction and the operation of the circuit indicated in FIG. 1 will be explained below.

14 represents a diode for detecting the lowest value of the collector potential of the output transistor 2.

The transistors 8 and 3 are cut-off at the peak of a horizontal blanking signal 22 corresponding to a horizontal blanking interval in the inputted video signal. Consequently, at this time, all the current flowing through the current source transistor 10 flows through the transistors 7 and 2. Therefore the collector potential of the output transistor 2 is lowest at this time. When the potential becomes lower than 15 $V_{DC}$, the output transistor 2 gets into the supersaturation region. On the contrary, when the potential exceeds 12 $V_{DC}$, the amplitude of signals at the collector potential of the output transistor 2 is excessively small. For avoiding both the supersaturation and the excessively small amplitude of signals, it is desirable to set the collector potential at the central value 18 $V_{DC}$ between 15 $V_{DC}$ and 24 $V_{DC}$.

A load capacitor 15 and a load resistor 16 for the detection are disposed at the output of the detection diode 14. That is, the diode 14, the capacitor 15 and the resistor 16 constitute a peak value detecting circuit. The output thereof is lowered by about 15 V by means of a level shift Zener diode 17. The output thereof is divided by resistors 18 and 19 and applied to the current source transistor 10 by an emitter follower 21, after low frequency components have been removed by a capacitor 20.

The explanation of the circuit construction of the principal part of the first embodiment of the present invention is terminated in the above. Now the negative feedback operation will be explained.

Now it is supposed that the lowest collector potential of the output transistor 2 is excessively low. Then, information that it is excessively low is transmitted through the diode 14, the Zener diode 17, the resistor 18 and the emitter follower 21 to decrease the current flowing through the transistor 10.

At this time, since the current flowing through the load resistor 4 is decreased, the collector potential of the output transistor 2 is raised. That is, the negative feedback operation is effected so that the excessively low collector potential of the output transistor 2 is compensated.

The explanation of the operation of the first embodiment of the present invention is terminated in the above. As understood from FIG. 1 indicating the first embodiment of the present invention, according to the present invention, the bias adjusting power supply which was required by the prior art technique (FIG. 6), is unnecessary.

For the prior art technique it was necessary to use an oscilloscope which is complicated to manipulate, in order to repair troubles in a cathode ray tube display used in an environment field. On the contrary, in a cathode ray tube display to which the present invention is applied, it is sufficient for such a repair to exchange parts or a base plate on which the circuit is mounted, and necessary repairs can be achieved with the omission complicated measurement operations. Therefore this is very valuable.

Next the second embodiment of the present invention will be explained, referring to FIG. 2. This figure is a circuit diagram showing a preamplifier portion disposed before the video output circuit which is the embodiment of the present invention indicated in FIG. 1. The purpose of disposing the preamplifier portion is to prevent burn-out of a CRT fluorescent surface, which is one of the secondary drawbacks of the prior art technique.

Now the circuit construction indicated in FIG. 2 will be explained. An output terminal in FIG. 2 is connected with the input terminal 12 in FIG. 1. An output terminal 23 in FIG. 2 is disposed for supplying 6 $V_{DC}$ to the terminal 23 in FIG. 1.

Figure 2:
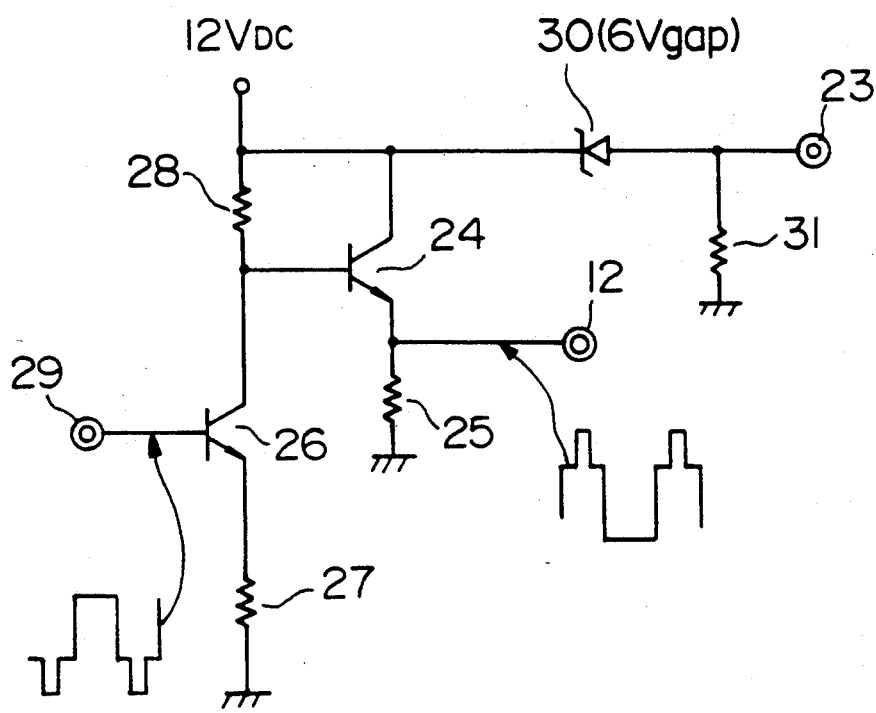
FIG. 2 is a circuit diagram indicating a prior art example of the video circuit for driving a cathode ray tube.

In FIG. 2, 24 is an emitter follower; 25 is an emitter resistor; 26 is a common emitter type amplifying transistor; 27 is an emitter resistor therefor; 28 is a collector resistor therefor; and 29 is a positive polarity video signal input terminal. 30 represents a Zener diode, whose gap voltage is 6 V, and 31 is a load resistor therefor.

Now the operation of the circuit indicated in FIG. 2 will be explained. In a transient state at switching-off of the power supply, the power supply 12 $V_{DC}$ in FIG. 2 begins to decrease. Consequently the negative polarity video signal output, i.e. the input signal through the terminal 12 in FIG. 1, begins also to decrease.

Now, at this time, the output voltage through the output terminal 23 in FIG. 2 begins to decrease by a same amount. These voltages (12 and 23) are applied to the bases of the differential amplifying pair of transistors 7 and 8 in FIG. 1, respectively. Consequently the output thereof is not shifted rapidly towards the white side at switching-off of the power supply. Therefore it is possible to prevent burn-out of the fluorescent surface of the CRT.

Since the CRT 1 is a very expensive part, it has an important significance to prevent the burn-out thereof. Therefore it can be said that the present embodiment has a high industrial value. The explanation of the second embodiment is terminated in the above.

Figure 3:
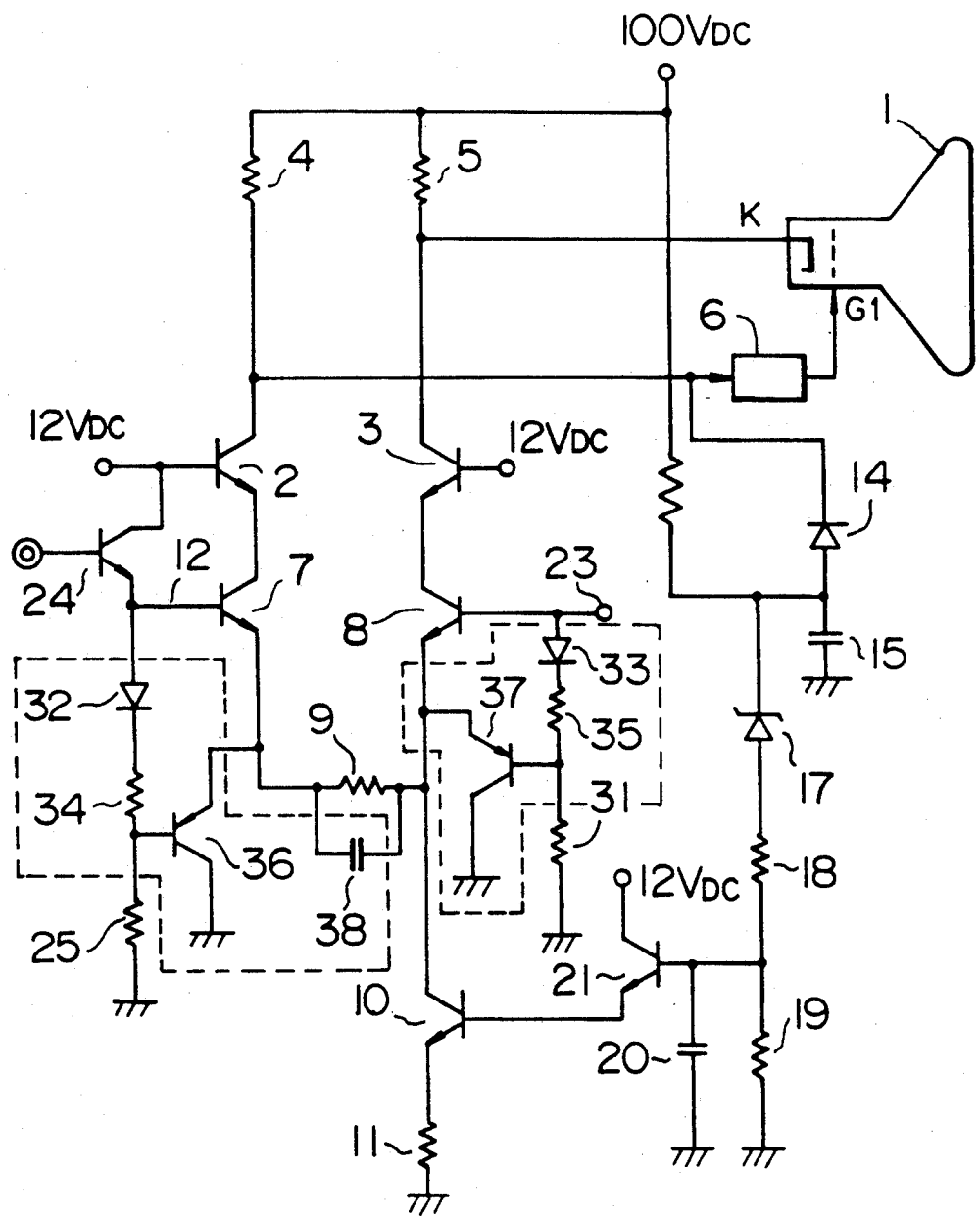
FIG. 3 is a circuit diagram indicating the principal part of a second embodiment of the present invention.

Next the third embodiment of the present invention will be explained, referring to FIG. 3. FIG. 3 is a circuit diagram showing the third embodiment of the present invention. Since differences of FIG. 3 from FIGS. 1 and 2 resides in circuit portions enclosed by broken lines in FIG. 3, these portions will be explained.

The object of the present embodiment is to improve the narrowness of the pulse response dynamic range, which was one of the secondary drawbacks of the prior art technique, so as to enlarge the dynamic range.

Hereinbelow the circuit construction enclosed by the broken lines will be explained. 38 is a high frequency emphasizing capacitor, which is connected in parallel with the differential driving emitter resistor 9 and works for preventing worsening of the image quality due to stray capacitances existing parasitically on the cathode K and the grid G1 of the CRT 1. The capacitor 38 itself belongs to a general emitter peaking circuit according to a well-known technique.

The originality of the present embodiment resides in the construction constituted by diodes 32, 33, resistors 34, 35 (in general level shift elements) and transistors 36, 37 (in general unidirectional elements). Now the operation thereof will be explained.

The diodes 32 and 33 are disposed for compensating the $V_{BF}$ drops (base-emitter voltage drop) of the transistors 7 and 8, respectively, which are about 0.6 V. Although the resistors 34 and 35 are disposed for compensating the $V_{BE}$ drops of about 0.6 V of the transistors 36 and 37, respectively, the drop voltages are set so as to be rather smaller (by about 0.5 V).

The reason why it is set so as to be rather smaller is to maintain the transistors 36 and 37 in the non-conductive state in a stationary state, where there are no pulse inputs.

On the other hand, in a state where there is a large amplitude pulse input, i.e. in a non-stationary state, at least one of the transistors 36 and 37 is made conductive. For example, in the case where a positive polarity pulse is included in the input voltage, the transistor 37 becomes conductive at the peak of that pulse. On the contrary, at the peak of a negative pulse, the transistor 36 becomes conductive.

In order to recognize correctly the effect of this embodiment, a case where there exist no transistors 36 and 37 should be presumed. In the case, the transistor 7 is switched-on and the transistor 8 is switched-off at the peak of an inputted positive pulse. The ON current of the transistor 7 cannot exceed the intensity of the current of the power supply transistor 10. Consequently the dynamic range thereof is limited by the current source at the peak of the positive pulse.

If there exists the transistor 37, the transistor 37 becomes conductive and current flows therethrough at the peak of the inputted positive pulse. Since the current flows through the transistor 7, the dynamic range of the transistor can be extended. The current flows through the transistor 2 to contribute to increase of the amplitude of the output pulse.

The time width of the pulse referred above is an extremely small width corresponding to one pixel on the display. Therefore, if transistor 37 were not provided, the pulse waveform would be apt to become dull by the reducing filtering action due to the stray capacitances existing parasitically on the electrodes of the CRT 1. That is, sharpness is apt to be lacking on the display. The addition of the transistor 37 is useful for restoring it.

Figure 4:
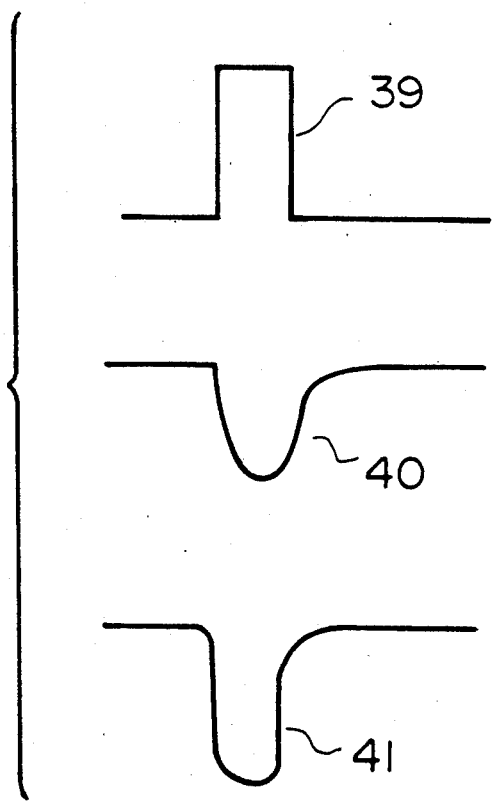
FIG. 4 is a circuit diagram indicating a third embodiment of the present invention.

FIG. 4 shows such pulse response waveforms. In the figure, 39 indicates an input waveform at the terminal 12; 40 an output voltage waveform of the transistor 2 in the case where there exists no transistor 37; and 41 an output waveform in the case where there exists the transistor 37. It would be recognized that the latter has a pulse waveform which is less dull and more sharp.

In the same way the transistor 36 acts usefully for an input negative pulse. In the third embodiment indicated in FIG. 3, diodes having a gap voltage, which is smaller than that of usual products (about 0.6 V), can be used instead of the resistors 34 and 35. The gap voltage can be reduced by choosing diodes having a large junction area.

Further other diodes may be used instead of the transistors 36 and 37. In particular, when they are used in combination with the embodiment of the present invention indicated in FIG. 1 in order to prevent that an excessive current flows through the transistor 37 in correspondence with a horizontal blanking signal, these should be constructed by diodes.

In the disclosure of the present invention, for the sake of simplifying explanation, one set of the drive circuit has been described. However, if three sets thereof are used in parallel, they can be used as an output circuit for driving a CRT for outputting color signals for 3 primary colors. It is clear that the present invention can be applied also to a CRT for a projection type display.

Figure 5:
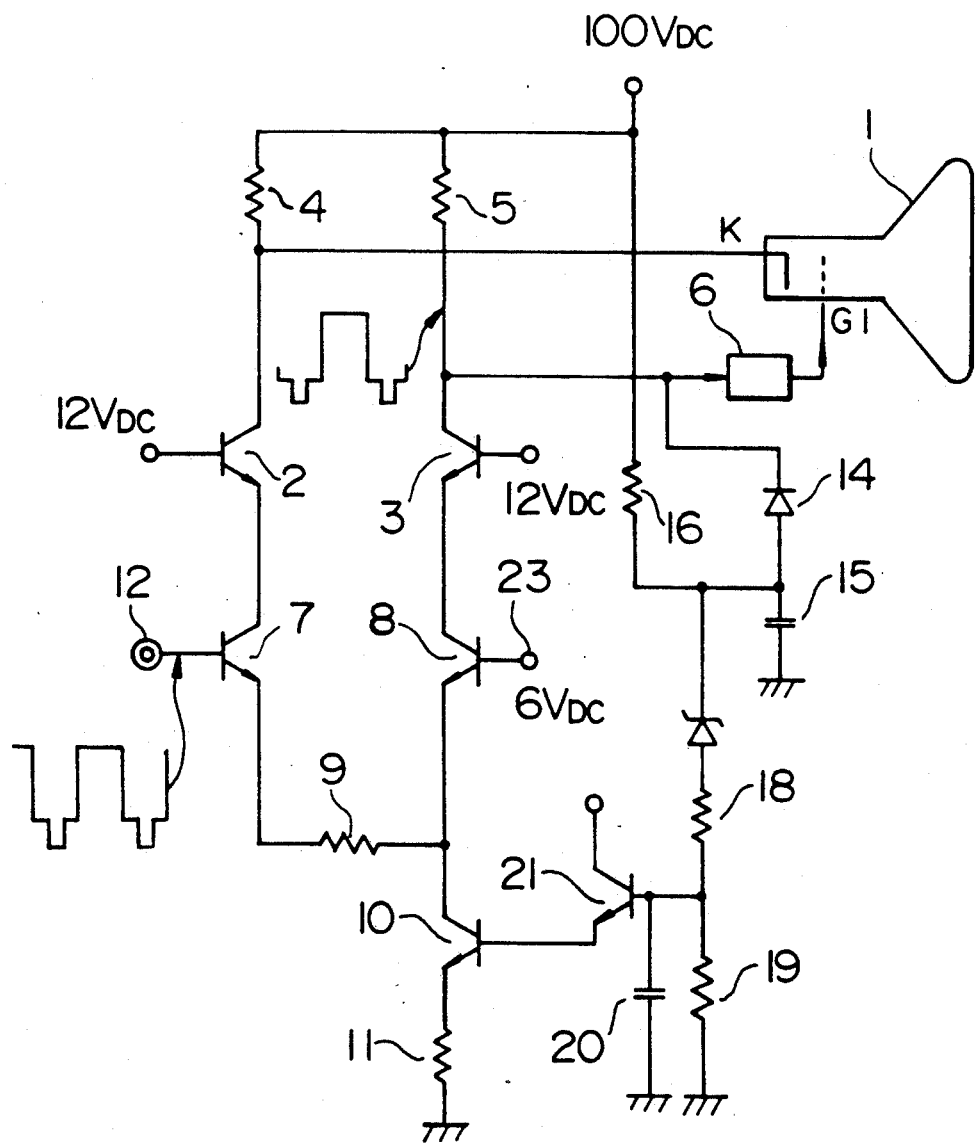
FIG. 5 indicates pulse response waveforms in the case where the present invention is applied and in the case where it is not applied.

Further, referring to FIGS. 1 and 3 indicating the first and the third embodiment of the present invention, explanation has been made on an assumption that negative polarity video signals are inputted. On the contrary, in the case where positive polarity video signals are inputted, if the circuit is constructed as indicated in FIG. 5, the first embodiment can be realized. That is, in composition with FIG. 1, the outputs to the electrodes K and G1 are exchanged by each other in FIG. 5. However the working principle remains same. In the same way the third embodiment can be also realized.

Furthermore, for the second embodiment (spot killer) described previously referring to FIG. 2, in the case of FIG. 5, it is sufficient to dispose a Zener diode between the terminal 23 and the ground terminal.

According to the present invention, the drawbacks of the prior art technique are overcome and the bias adjusting power supply, whose regulation was complicated and difficult, can be replaced by the new negative feedback circuit. Consequently it is possible to construct an output circuit for driving a CRT, which is excellent in maintenance and service. Furthermore the problems of burn-out of the fluorescent layer in the CRT and worsening in pulse response characteristics, which were thought to be secondary drawbacks of the prior art technique, can be overcome. Consequently the present invention is valuable in the industrial field.

What is claimed is:

1. A video circuit for driving a cathode ray tube of a type by which an inputted video signal is amplified by a differential amplifying circuit, an output of which is applied to a grid electrode and a cathode electrode of the cathode ray tube in a differential manner, comprising:

current source means for supplying current to said differential amplifying circuit;

detecting diode means for detecting a minimum peak output voltage of a grid side output transistor of said differential amplifying circuit in a horizontal blanking interval;

filtering means for smoothing an output voltage of said detecting diode means; and control means for effecting negative feedback control so that an output potential of said grid side output transistor is made constant by controlling the current of said current source means in accordance with the output voltage of said detecting diode means.

2. A video circuit for driving a cathode ray tube according to claim 1, wherein preamplifying means for amplifying said inputted video signal is disposed on an input side of said differential amplifying circuit; said preamplifying means including at least a load resistor provided at an output end, said load resistor being connected to a power supply means; an output voltage of said preamplifying means being taken out from said load resistor and being transmitted to one of input terminals of said differential amplifying circuit; and a voltage being taken out from said power supply side of said load resistor and being transmitted to another input terminal of said differential amplifying circuit through a level shift element.

3. A video circuit for driving a cathode ray tube according to claim 1, further comprising:

level shift means for level-shifting at least one of the input voltages at the two input terminals of said differential amplifying circuit; and unidirectional conducting element means connected between an output side of said level shift means and an emitter; electrode of said differential amplifying circuit.

4. A video circuit for driving a cathode ray tube according to claim 1, further comprising preamplifying means for amplifying said inputted video signal and being disposed on an input side of said differential amplifying circuit.

5. A video circuit for driving a cathode ray tube according to claim 1, further comprising level shift means for level-shifting at least one of the input voltages at the two input terminals of said differential amplifying circuit.

6. A video circuit for driving a cathode ray tube according to claim 4, further comprising level shift means for level-shifting at least one of the input voltages at the two input terminals of said differential amplifying circuit.

* * * * *